(12) United States Patent
Dawood

(10) Patent No.: US 11,190,787 B2
(45) Date of Patent: Nov. 30, 2021

(54) MULTI-PIXEL CACHING SCHEME FOR LOSSLESS ENCODING

(71) Applicant: Citrix Systems, Inc., Fort Lauderdale, FL (US)

(72) Inventor: Muhammad A. Dawood, Cambridge (GB)

(73) Assignee: CITRIX SYSTEMS, INC., Fort Lauderdale, FL (US)

( * ) Notice: Subject to any disclaimer, the term of this patent is extended or adjusted under 35 U.S.C. 154(b) by 5 days.

(21) Appl. No.: 16/687,014

(22) Filed: Nov. 18, 2019

(65) Prior Publication Data

US 2020/0084462 A1    Mar. 12, 2020

Related U.S. Application Data

(63) Continuation of application No. 15/353,534, filed on Nov. 16, 2016, now Pat. No. 10,523,956.

(51) Int. Cl.
*H04N 19/42* (2014.01)
*G09G 5/36* (2006.01)
(Continued)

(52) U.S. Cl.
CPC .............. *H04N 19/42* (2014.11); *G09G 5/006* (2013.01); *G09G 5/06* (2013.01); *G09G 5/363* (2013.01);
(Continued)

(58) Field of Classification Search
CPC .................................. H04N 19/42; G09G 5/06
See application file for complete search history.

(56) References Cited

U.S. PATENT DOCUMENTS

| 4,988,998 A | 1/1991 | O'Brien |
| 5,964,842 A | 10/1999 | Packard |

(Continued)

FOREIGN PATENT DOCUMENTS

| JP | H7-336696 A | 12/1995 |
| JP | H07336696 A | 12/1995 |

(Continued)

OTHER PUBLICATIONS

Smith, S.W., "Chapter 27 Data Compression," The Scientist and Engineer's Guide to Digital Signal Processing, Jan. 1, 1997 (Jan. 1, 1997), pp. 481-502, XP05517144, ISBN:978-0-96-601763-2.
(Continued)

*Primary Examiner* — Jerry T Jean Baptiste
(74) *Attorney, Agent, or Firm* — Fox Rothschild LLP; Robert J. Sacco; Carol E. Thorstad-Forsyth

(57) ABSTRACT

Systems and methods are provided for encoding a multi-pixel caching scheme for lossless encoders. The systems and methods can include obtaining a sequence of pixels, determining repeating sub-sequences of the sequence of pixels consisting of a single repeated pixel and non-repeating sub-sequences of the sequence of pixels, responsive to the determination, encoding the repeating sub-sequences using a run-length of the repeated pixel and encoding the non-repeating sub-sequences using a multi-pixel cache, wherein the encoding using a multi-pixel cache comprises, encoding non-repeating sub-sequences stored in the multi-pixel cache as the location of the non-repeating sub-sequences in the multi-pixel cache, and encoding non-repeating sub-sequences not stored in the multi-pixel cache using the value of the pixels in the non-repeating sub-sequences.

20 Claims, 9 Drawing Sheets

(51) Int. Cl.

| | |
|---|---|
| *H03M 7/14* | (2006.01) |
| *H03M 7/30* | (2006.01) |
| *G09G 5/06* | (2006.01) |
| *H04N 19/593* | (2014.01) |
| *H03M 7/48* | (2006.01) |
| *G09G 5/00* | (2006.01) |
| *H04N 19/182* | (2014.01) |
| *H04N 19/93* | (2014.01) |
| *H04N 19/94* | (2014.01) |

(52) U.S. Cl.
CPC ........... *H03M 7/14* (2013.01); *H03M 7/3088* (2013.01); *H03M 7/48* (2013.01); *H03M 7/702* (2013.01); *H04N 19/182* (2014.11); *H04N 19/593* (2014.11); *H04N 19/93* (2014.11); *G09G 2330/021* (2013.01); *G09G 2340/04* (2013.01); *G09G 2360/08* (2013.01); *G09G 2360/18* (2013.01); *H04N 19/94* (2014.11)

(56) References Cited

U.S. PATENT DOCUMENTS

| | | | |
|---|---|---|---|
| 2004/0131115 A1 | 7/2004 | Burgess et al. | |
| 2005/0105608 A1 | 5/2005 | Coleman et al. | |
| 2005/0117806 A1* | 6/2005 | Rosenberg | H04N 19/51 382/232 |
| 2005/0286784 A1 | 12/2005 | Gilgen | |
| 2007/0008330 A1 | 1/2007 | Xu | |
| 2007/0030178 A1 | 2/2007 | Lee et al. | |
| 2010/0293248 A1 | 11/2010 | Kamay et al. | |
| 2014/0063030 A1 | 3/2014 | Metcalfe | |
| 2014/0149684 A1* | 5/2014 | Lee | G06F 12/0875 711/141 |
| 2014/0268194 A1 | 9/2014 | Pugh et al. | |
| 2016/0322010 A1* | 11/2016 | Amino | G09G 3/2092 |
| 2017/0109108 A1* | 4/2017 | Pugh | G06F 3/1245 |

FOREIGN PATENT DOCUMENTS

| | | |
|---|---|---|
| JP | H09-036747 A | 2/1997 |
| WO | 2015058397 A1 | 4/2015 |
| WO | 2015131304 A1 | 9/2015 |
| WO | 2016015016 A1 | 1/2016 |
| WO | 2016049560 A1 | 3/2016 |

OTHER PUBLICATIONS

Li, YiFu, et al., "Hybrid Pizel Encoding: An Effective Display Frame Compression Algorithm for HD Video Decoder," Computational Science and Engineering (CSE), 2012 IEEE 15th International Conferencfe on, IEEE, Dec. 5, 2012 (Dec. 5, 2012), pp. 303-309, XP032315136, DOI: 10.1109/ICCSE.2012.49, ISBN: 978-1-4673-5165-2, sections III and IV.

International Search Report and Written Opinion for PCT/ US2017/061988 dated Feb. 13, 2018.

Notice of Reasons for Refusal issued in Japanese Patent Application No. 2019-513308 dated Jul. 2, 2020.

Office Action issued in KR 10-2019-7006839 dated Feb. 3, 2021.

\* cited by examiner

MULTI-PIXEL CACHING SCHEME FOR LOSSLESS ENCODING

CROSS REFERENCE TO RELATED APPLICATIONS

The present application is a continuation of U.S. patent application Ser. No. 15/353,534 filed Nov. 16, 2016. The entirety of this application is incorporated herein by reference.

BACKGROUND

Modern computing systems are capable of running a large variety of software applications and platforms. A computing system can provide an operating system allowing applications executing on the computing system to access and interact with hardware components of the computing system. Through this interaction, the software applications can accept user input and provide output, which can be presented to the user through a graphical user interface presented on a display device. Additionally, the output can be forwarded to a remote computing device.

Remote computing technologies allow users to use a computing system without being physically located at the computing system. Through remote access, users can connect to a remote computing system over a public or private network. The user can use a local computing system to send input to the remote computing system and the remote computing system can respond. Although not physically present at the remote computing system, the user can interact with the remote computing system as though the user was using the system directly.

Additionally, virtualization technologies have become widely used for sharing limited computer hardware resources. In a hardware virtualization environment, sometimes also referred to as a platform virtualization environment, one or more virtual machines can simulate a host computer with its own operating system. In particular, software executed on these virtual machines can be separated from the underlying hardware resources. As a result, virtual machines running on a same host computer can each have its own operating system. For example, a computer that is running Microsoft Windows operating system may host a virtual machine that simulates a computer running a Linux operating system, based on which Linux-based software can be executed.

Further, virtualization technologies can provide remote access to computer resources across public or private networks. Users can use a variety of clients to access a virtual desktop or applications running on a host computer in the virtualized environment. These clients can be directly connected to the host computer or they can connect to the virtualized environment through a public or private network. The client can capture user input and transfer it across the network to the host computer's virtual environment. The application receiving the user input can respond by performing some action and presenting a response to the user. Virtualization allows multiple users to share hardware resources instead of requiring that each user connect to a dedicated remote computing system.

Applications running in a remote, local, or virtualized computing environment can respond to user input updating the output for display on a display device. An application can provide the operating system with instructions to update the graphical user interface. The operating system can then process the commands and display the update on a graphical interface. In many current and past system architectures, applications could write directly to a frame buffer through the operating system. In addition to the frame to be displayed, the operating system could provide the raw draw commands and additional information about the updated display frame such as the content type of the displayed content, the modified region of the output display frame, and other metadata about the output display frame. This information can be useful for remote technologies because instead of simply sending a bandwidth intensive graphic representing a visual display over a network, the system could combine the raw draw commands and the additional information about the display frame to optimize data sent to the remote computing environment. This optimization allowed for a much better user experience while limiting the network bandwidth required for remote computing.

Modern operating systems have moved away from past display mechanisms, relying instead on offloading rendering of the user interface to graphics processing units. As a result, the operating system receives updates from the applications, composites those updates into a display frame using the graphics processing unit, and provides a graphic or bitmap representing the composited frame to the display device or graphics system. The graphics system of the computing environment only receives a final composited display frame without any additional metadata or draw commands. Accordingly, a graphics driver forwarding the display to a remotely connected user can no longer benefit from the previously provided information, and there exists a need for improving the efficiency of the processing, encoding and delivery of display frames in virtual and remote computing environments.

BRIEF DESCRIPTION OF THE DRAWINGS

Reference will now be made to the accompanying drawings showing example embodiments of this disclosure. In the drawings.

DETAILED DESCRIPTION

Figure 1:
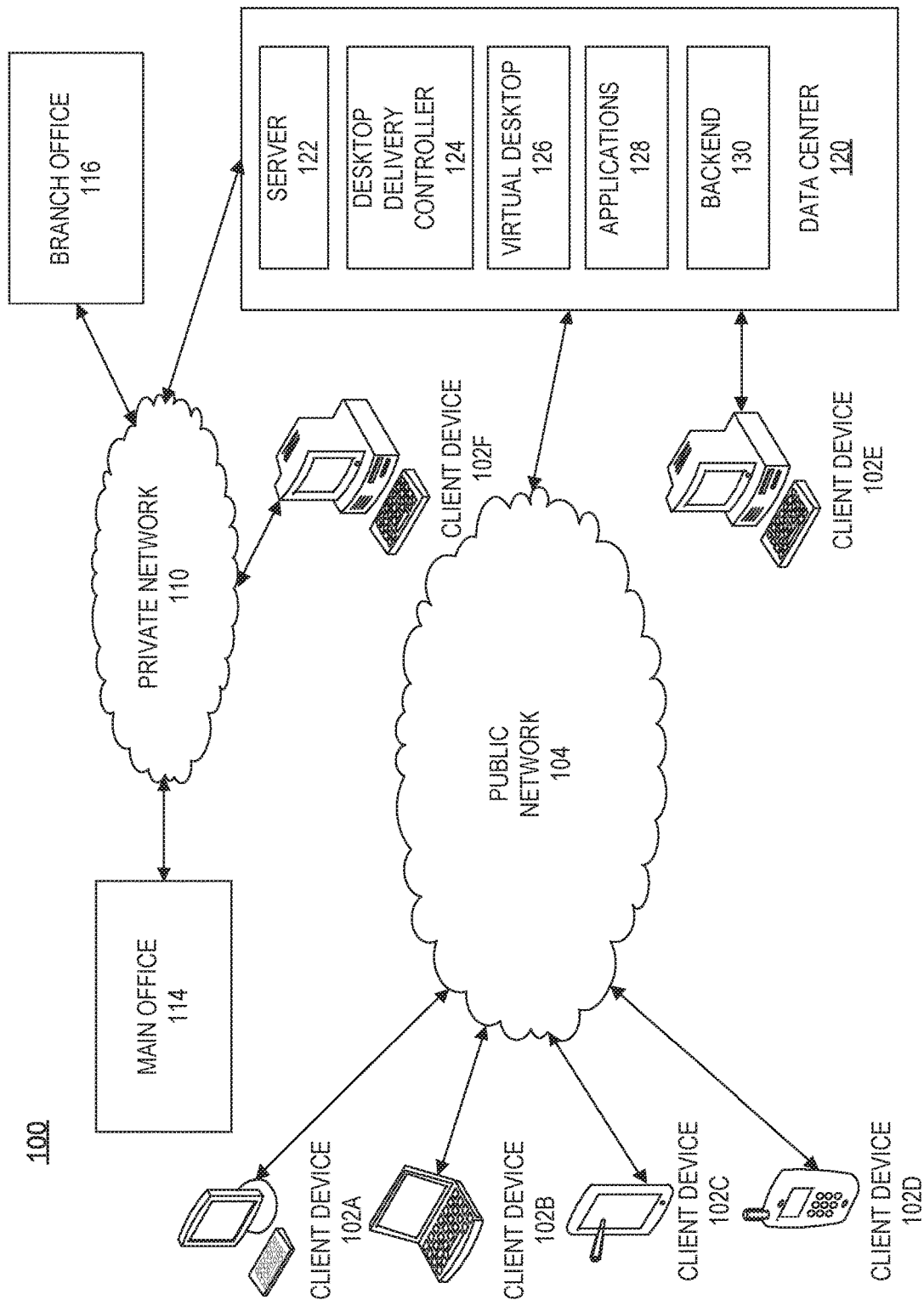
FIG. 1 is a block diagram of an exemplary network environment, consistent with embodiments of the present disclosure.

Reference will now be made in detail to the exemplary embodiments implemented according to the present disclosure, the examples of which are illustrated in the accompanying drawings. Wherever possible, the same reference numbers will be used throughout the drawings to refer to the same or like parts.

The embodiments described herein provide technologies and techniques for encoding display frame data. These technologies can operate in both a virtual and non-virtual environment, allowing for the optimization of display output that is forwarded to remote clients. These techniques provide improvements in the compression of encoded frames and reduce bandwidth usage in the transmission of display data across public and private networks. This can provide a better end user experience over bandwidth-limited networks or can reduce costs where pay-per-byte, pay as you go, or otherwise limited data schemes are in use (e.g., cellular data plans). Additionally, the technologies and techniques described herein can provide efficient encoding with minimal or negligible increases in computing resource requirements.

According to embodiments consistent with the present disclosure, display frame data can be encoded using a variety of encoding methods. For example, some regions of a display frame can be encoded using a lossy compression algorithm (e.g., Joint Photographic Experts Group ("JPEG") or Tagged Image File Format (TIFF) container holding compressed JPEG) in order to reduce the memory footprint of those regions. Further, other regions of the display frame can be encoded using a lossless compression algorithm (e.g., Graphics Interchange Format ("GIF") for eight bits per pixel data, Portable Network Graphics ("PNG"), TIFF container holding PackBits, TrueVision TGA ("TGA"), or Run Length Encoding ("RLE")) in order to preserve quality. The compression ratio achieved during lossless encoding can be significantly lower compared with the compression ratio achieved during lossy encoding. This has necessitated new mechanisms for optimizing the lossless encoding of the display frame data.

Embodiments consistent with the present disclosure include systems and methods for a multi-pixel caching scheme for lossless encoders. The systems and methods can include obtaining a sequence of pixels, determining repeating sub-sequences of the sequence of pixels consisting of a single repeated pixel and non-repeating sub-sequences of the sequence of pixels, responsive to the determination, encoding the repeating sub-sequences using a run-length of the repeated pixel and encoding the non-repeating sub-sequences using a multi-pixel cache, wherein the encoding using a multi-pixel cache comprises, encoding non-repeating sub-sequences stored in the multi-pixel cache as the location of the non-repeating sub-sequences in the multi-pixel cache, and encoding non-repeating sub-sequences not stored in the multi-pixel cache using the value of the pixels in the non-repeating sub-sequences.

The embodiments described herein can provide improved encoding of image and other data in order to reduce the bandwidth needed for transmission while requiring negligible increases in the consumption of computer resources. In systems for encoding visual data where each raw pixel is represented using three bytes of data (one byte of data each for the red (R), green (G) and blue (B) components of the pixel), embodiments consistent with present disclosure can utilize a multi-pixel cache to store and encode a repeated sequences that includes many different pixels using just two bytes of data for the sequence. The disclosed technologies minimize the amount of data needed to represent sequences of pixels and provide improvements over existing lossless encoding methods. In current environments where a single image or frame of video can consist of millions of pixels, reductions in storage at the pixel level can yield massive gains in efficiency and significant decreases in the necessary bandwidth and resources for providing encoded data across networks.

FIG. 1 is a block diagram of an exemplary network environment 100. While exemplary network environment 100 is directed to a virtual network environment, it is appreciated that the network environment can be any type of network that communicates using packets. Network environment 100 can include one or more client devices 102A-F, a public network 104, a private network 110, a main office 114, a branch office 116, and a data center 120.

One or more client devices 102A-F (collectively as 102) are devices that can acquire remote services from data center 120 through various means. Client devices 102A-F can communicate with data center 120 either directly (e.g., client device 102E) or indirectly through a public network 104 (e.g., client devices 102A-D) or a private network 110 (e.g., client device 102F). In some embodiments, a main office 114 and a branch office 116 can also include one or more client devices that are similar to client devices 102A-F. Main office 114 can be located, for example, in a principal place of business of a company. Branch office 116 can be located, for example, remote to main office 114. In some embodiments, the client devices of main office 114 and branch office 116 can also acquire remote services from data center 120 through, for example, private network 110.

When client device 102 communicates through public network 104 or private network 110, a communication link can be established. For example, a communication link can be established by public network 104, thereby providing a client device (e.g., client devices 102A-D) access to data center 120. A communication link can also be established by private network 110, thereby providing client device 102F, main office 114 and/or branch office 116 accesses to data center 120. While client devices 102A-D are portrayed as a computer (e.g., client devices 102A), a laptop (e.g., client device 102B), a tablet (e.g., client device 102C), and a mobile smart phone (e.g., client device 102D), it is appreciated that client device 102 could be any type of device (e.g., such as a smartwatch or any other wearable device) that communicates packets to and from data center 120.

Public network 104 and private network 110 can be any type of network such as a wide area network (WAN), a local area network (LAN), or a metropolitan area network (MAN). As an example, a WAN can be the Internet or the World Wide Web, and a LAN can be a corporate Intranet. Public network 104 and private network 110 can be a wired network, a wireless network, or a combination of both.

Data center 120 can be a central repository, either physical or virtual, for the storage, management, and dissemination of data and information pertaining to a particular public or private entity. Data center 120 can be used to house computer systems and associated components, such as one or physical servers, virtual servers, and storage systems. Data center 120 can include, among other things, one or more servers (e.g., server 122), a desktop delivery controller 124, a virtual desktop 126, applications 128, and a backend system 130.

Server 122 can be an entity represented by an IP address and can exist as a single entity or a member of a server farm. Server 122 can be a physical server or a virtual server. In some embodiments, server 122 includes a hardware layer, an operating system, a communication subsystem, and a hypervisor creating or managing one or more virtual machines. Server 122 can provide one or more services to an endpoint. These services can include providing one or more applications 128 to one or more endpoints (e.g., client devices 102A-F). For example, one or more applications 128 can include Windows™- or SAP™-based applications and computing resources. Via the communication subsystem, server 122 can communicate with other devices (e.g., client devices 102) through various types of networks (e.g., private network 110 and public network 104). Server 122 can include features provided in other components of data center 120, such as virtual desktop 126, applications 128, and/or desktop delivery controller 124. In some embodiments, a client device acts as server 122 by providing functionality consistent with server 122.

Desktop delivery controller 124 can be a device that enables delivery of services, such as virtual desktops 126 to client devices (e.g., client devices 102A-F). Desktop delivery controller 124 can provide functionality required to manage, maintain, and optimize all virtual desktop communications. In some embodiments, desktop delivery controller 124 can control, manage, maintain, or optimize the provisioning of applications 128.

In some embodiments, one or more virtual desktops 126 provide one or more applications 128. Virtual desktops 126 can include hosted shared desktops allowing multiple users to access a single shared remote-desktop-services desktop, virtual desktop infrastructure desktops allowing each user to have their own virtual machine, streaming disk images, a local virtual machine, individual applications (e.g., one or more applications 128), or a combination thereof. Users can interact with one or more of the virtual desktops 126 through client device 102. In some embodiments, virtual desktop 126 responds to user input by providing an updated visual display forwarded from the virtual desktop to the client device.

Backend system 130 can be a single or multiple instances of computer networking hardware, appliances, or servers in a server farm or a bank of servers. Backend system 130 can interface directly or indirectly with server 122. For example, backend system 130 can include Microsoft™ Active Directory, which can provide a number of network services, including lightweight directory access protocol (LDAP) directory services, Kerberos-based authentication, domain name system (DNS) based naming and other network information, and synchronization of directory updates amongst several servers. Backend system 130 can also include, among other things, an Oracle backend server, a SQL Server backend, and/or a dynamic host configuration protocol (DHCP) server. Backend system 130 can provide data, services, or a combination of both to data center 120, which can then provide that information in varying forms to client devices 102 or branch office 140.

Figure 2A:
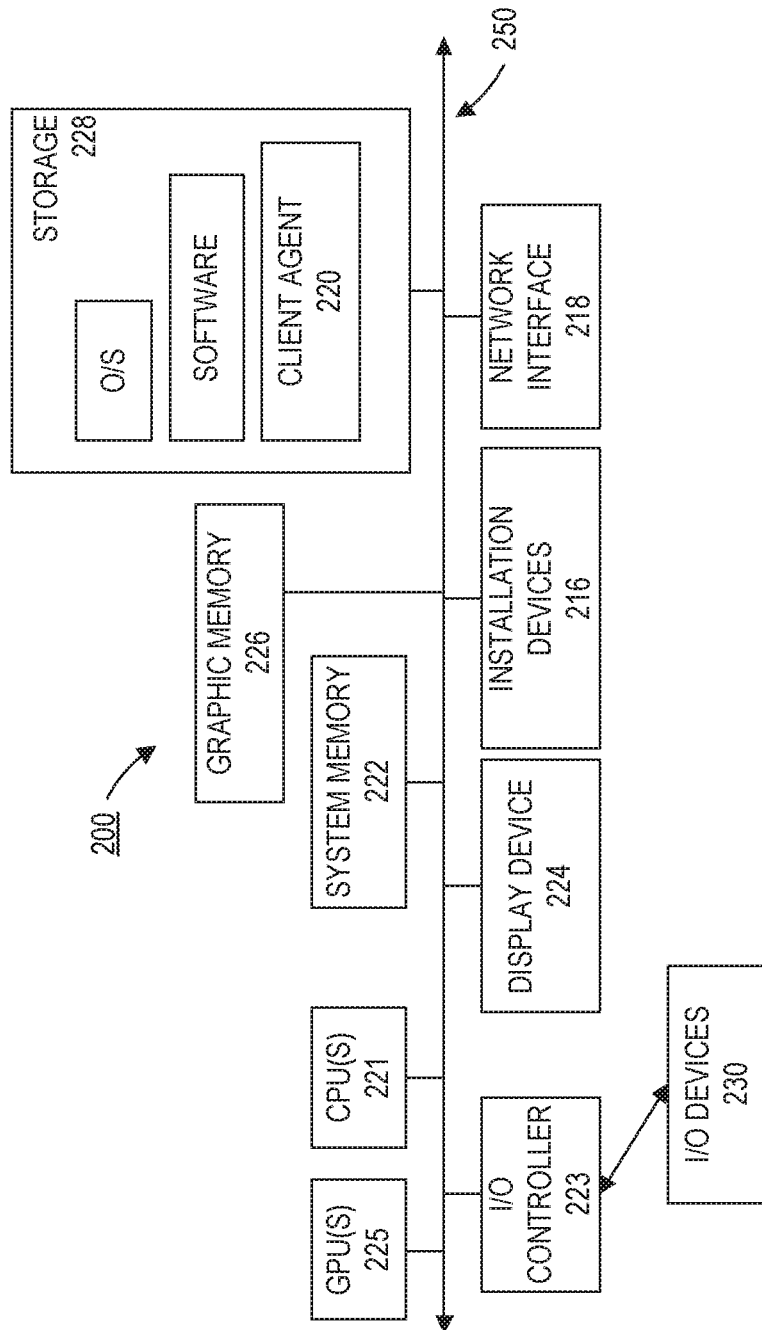
FIGS. 2A-2C are block diagrams of an exemplary computing device, consistent with embodiments of the present disclosure.
Figure 2B:
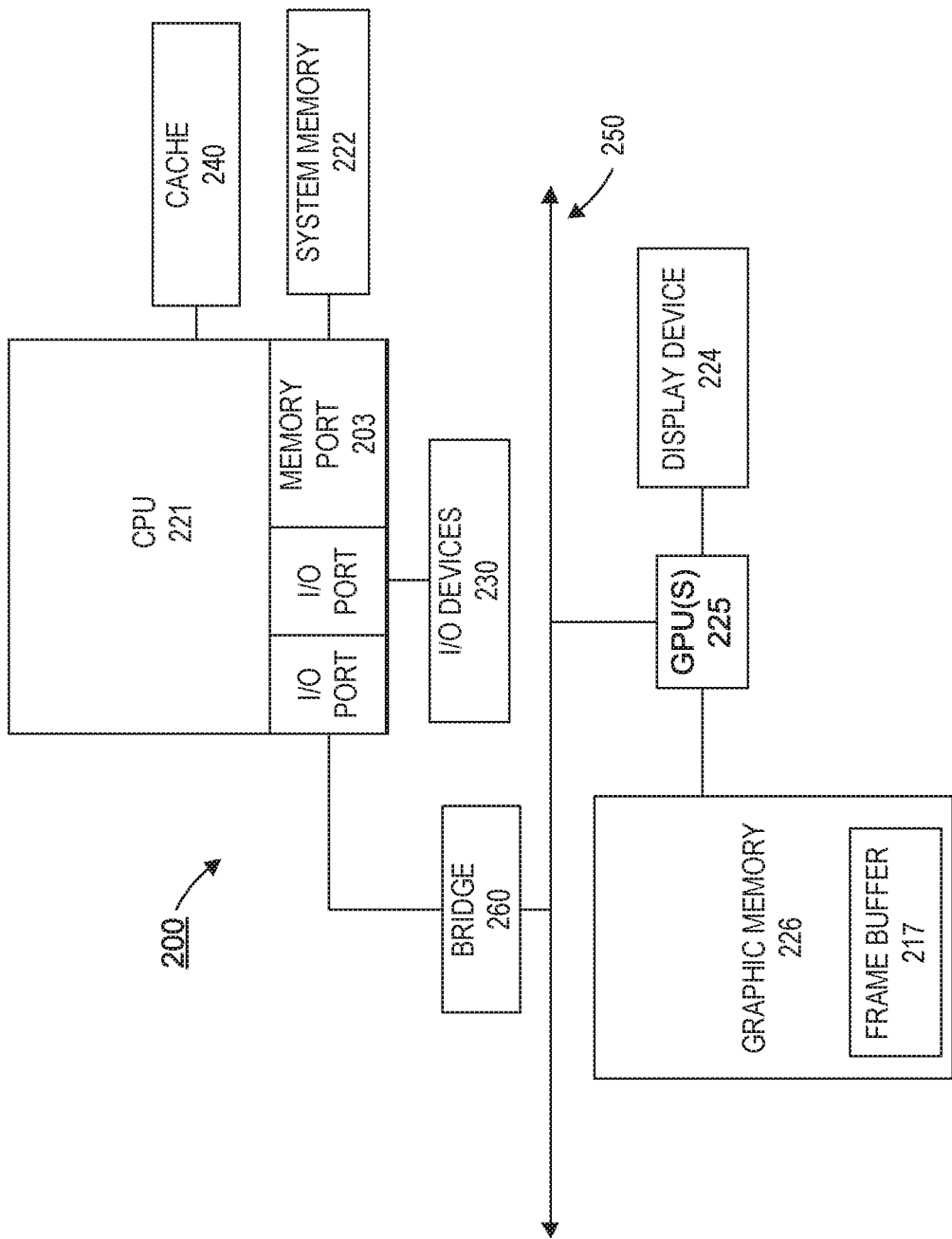
Figure 2C:
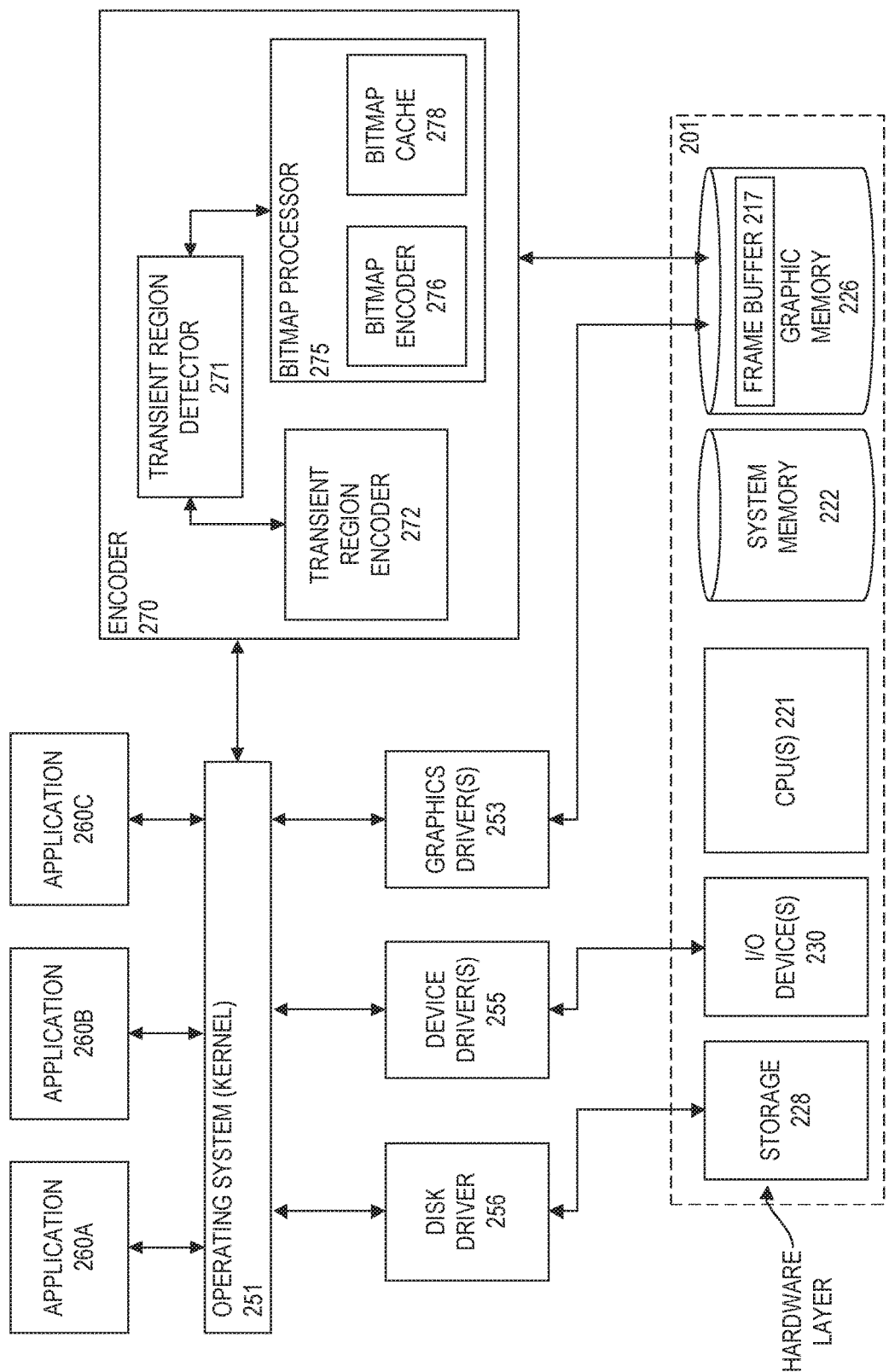

FIGS. 2A-2C are block diagrams of an exemplary computing device 200, consistent with embodiments of the present disclosure. Computing device 200 can be server 122 in data center 120 as shown in FIG. 1. As shown in FIG. 2A, computing device 200 can include one or more central processing units (CPUs) 221, one or more graphics processing units (GPUs 225), a system memory 222, and a graphic memory 226. CPUs 221 can be any logic circuitry that responds to and processes instructions fetched from the system memory 222. CPUs 221 can be a single or multiple microprocessors, field-programmable gate arrays (FPGAs), or digital signal processors (DSPs) capable of executing particular sets of instructions stored in a memory (e.g., system memory 222) or a cache (e.g., cache 240). CPUs 221 can also contain a plurality of processor registers for storing variable types of data. For example, these registers can store data, instructions, floating point values, conditional values, and/or addresses for locations in system memory 222. CPU registers can include special purpose registers used to store data associated with the running process such as an instruction pointer, instruction counter, and/or a memory stack pointer. The system memory 222 can include a tangible and/or non-transitory computer-readable medium, such as a flexible disk, a hard disk, a CD-ROM (compact disk read-only memory), MO (magneto-optical) drive, a DVD-ROM (digital versatile disk read-only memory), a DVD-RAM (digital versatile disk random-access memory), a flash drive and/or flash memory, processor cache, memory register, or a semiconductor memory. System memory 222 can be one or more memory chips capable of storing data and allowing any storage location to be directly accessed by CPUs 221. System memory 222 can be any type of random access memory (RAM), or any other available memory chip capable of operating as described herein. In the exemplary embodiment shown in FIG. 2A, CPUs 221 can communicate with system memory 222 via a system interface 250. GPUs 225 can be any type of specialized circuitry that can manipulate and alter memory (e.g., graphic memory 226) to provide and/or accelerate the creation of images stored in a frame buffer (e.g., frame buffer 217 shown in FIG. 2B) for output to a display device (e.g., display device 224). GPUs 225 can have a highly parallel structure making them more effective than general-purpose CPUs 221 for algorithms where processing of large blocks of graphical data can be performed in parallel. Furthermore, the functionality of GPUs 225 can also be included in a chipset of in some other type of special purpose processing unit or co-processor.

CPUs 221 can connect to system memory 222 and system interface 250. CPUs 221 can execute programming instructions stored in the system memory 222, operate on data stored in system memory 222 and communicate with the GPUs 225 through the system interface 250, which bridges communication between the CPUs 221 and GPUs 225. In some embodiments, CPUs 221, GPUs 225, system interface 250, or any combination thereof, can be integrated into a single processing unit. GPUs 225 can be capable of executing particular sets of instructions stored in system memory 222 to manipulate graphical data store in system memory 222 or graphic memory 226. For example, GPUs 225 can receive instructions transmitted by the CPUs 221 and processes the instructions in order to render graphics data stored in the graphic memory 226. Graphic memory 226 can be any memory space accessible by GPUs 225, including local memory, system memory, on-chip memories, and hard disk. GPUs 225 can enable displaying of graphical data stored in graphic memory 226 on display device 224.

Computing device 200 can also include display device 224 and an input/output (I/O) device 230 (e.g., a keyboard, mouse, or pointing device) connected through an I/O controller 223, both of which communicate via system interface 250. It is appreciated that CPUs 221 can also communicate with system memory 222 and other devices in manners other than through system interface 250, such as through serial communication manners or point-to-point communication manners. Similarly, GPUs 225 can also communicate with graphic memory 226 and other devices in manners other than system interface 250. Furthermore, I/O device 230 can also provide storage and/or an installation medium for computing device 200.

FIG. 2B depicts an embodiment of an exemplary computing device 200 in which CPUs 221 communicates directly with system memory 222 via a memory port 203, and similarly GPUs 225 communicates directly with graphic memory 226. CPUs 221 can communicate with a cache 240 via a secondary bus, sometimes referred to as a backside bus. In some embodiments, CPUs 221 communicate with cache 240 via system interface 250. Cache 240 typically has a faster response time than system memory 222. In some embodiments, such as the embodiment shown in FIG. 2B, CPUs 221 communicate directly with I/O device 230 via an I/O port. In further embodiments, I/O device 230 can be a bridge 260 between system interface 250 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a HIPPI bus, a Super HIPPI bus, a SerialPlus bus, a SCI/LAMP bus, a FibreChannel bus, a Thunderbolt™ bus, or a Serial Attached small computer system interface bus.

As shown in FIG. 2B, GPUs 225 can also communicate directly with graphic memory 226 and display device 224. GPUs 225 can communicate with CPUs 221 and other devices through system interface 250. Graphic memory 226 can also include a frame buffer 217. Frame buffer 217 can be a graphic output device that drives a display device (e.g., display device 224) from a memory buffer of graphic memory 226 containing a complete frame of graphical data. Frame buffer 217 can store the final graphic frames, which are to be displayed on display device 224.

As shown in FIG. 2A, computing device 200 can support any suitable installation device 216, such as a floppy disk drive for receiving floppy disks such as 3.5-inch, 5.25-inch disks or ZIP disks; a CD-ROM drive; a CD-R/RW drive; a DVD-ROM drive; tape drives of various formats; a USB device; a hard-drive; flash drive; or any other device suitable for installing software and programs such as any client agent 220, or portion thereof. Computing device 200 can further comprise a storage device 228, such as one or more hard disk drives or redundant arrays of independent disks, for storing an operating system and other related software, and for storing application software programs such as any program related to client agent 220. Optionally, any of the installation devices 216 could also be used as storage device 228.

Furthermore, computing device 200 can include a network interface 218 to interface to a LAN, WAN, MAN, or the Internet through a variety of connections including, but not limited to, standard telephone lines, LAN or WAN links (e.g., 802.11, T1, T3, 56 kb, X.25), broadband connections (e.g., ISDN, Frame Relay, ATM), wireless connections, or some combination of any or all of the above. Network interface 218 can comprise a built-in network adapter, network interface card, PCMCIA network card, card bus network adapter, wireless network adapter, USB network adapter, modem or any other device suitable for interfacing computing device 200 to any type of network capable of communication and performing the operations described herein.

In some embodiments, an operating system executes on the components of computing device 200. The operating system can use a graphics driver to interact with the graphics system (e.g., GPUs 225, graphic memory 226, frame buffer 217, and display device 224). A graphics driver can exist in a virtualized and non-virtualized computing environment. The graphics driver can instruct GPUs 225 to perform operations and store the results in frame buffer 217 for display on display device 224. In some embodiments, instead of displaying the contents of frame buffer 217 on display device 224, the graphics driver further processes the display frames stored in frame buffer 217 and forward the contents of frame buffer 217 to a communicatively coupled (e.g., through network interface 218) computing device (e.g., client 102).

FIG. 2C depicts an embodiment of an exemplary computing device 200. Computing device 200 can include storage 228, I/O device(s) 230, CPU(s) 221, system memory 222, frame buffer 217, graphic memory 226 as part of a hardware layer 201 (which can be structured as shown in FIGS. 2A-2B). Computing device 200 can execute operating system 251. Additionally, computing device 200 can execute applications 260A-C. Applications 260A-C can use functionality provided by operating system 251 to interact with the hardware layer 201 provided by computing device 200.

Operating system 251 can use device drivers to communicate with components in hardware layer 201. For example, operating system 251 can use disk driver 256 to interact with storage 228, device driver(s) 255 to interact with various I/O devices 230, and graphics driver 253 to interact with frame buffer 217, graphic memory 226, and other aspects of the graphics system (e.g., GPU(s) 225 and display device 224 as shown in FIGS. 2A-2B). Computing device 200 could contain many additional device drivers to facilitate interaction with other hardware not pictured.

Additionally, operating system 251 can interact with components designed to perform different tasks related to enhance computing device 200. Encoder 270 can communicate with operating system 251 and frame buffer 217 to further process display frames produced by operating system 251. Encoder 270 can provide special functionality to optimize transmission of the display frames to remote computing devices (e.g., client device 102). In some embodiments, encoder 270 encodes a display frame reducing the storage footprint and providing a balance between size and quality for transmitting the display frame across a network.

Encoder 270 is one or more modules, which can be packaged functional hardware units designed for use with other components (e.g., portions of an integrated circuit) or a part of a program (stored on a computer readable medium) that performs a particular function of related functions. The one or more modules of encoder 270 can include a transient region detector 271, a transient region encoder 272, and a bitmap processor 275. In some embodiments, these components are separate modules communicatively coupled to encoder 270 instead of contained within encoder 270. Transient region detector 271 can be one or more modules for comparing the display frame with previous display frames and data stored in memory (e.g., system memory 222, cache 240, or CPU registers) to determine regions of the screen that are rapidly changing. Various characteristics can indicate a region is transient. Transient region detector 271 can divide a display frame into transient regions provided to the transient region encoder 272 and non-transient regions provided to bitmap processor 275. In some embodiments, transient region detector 271 detects when a previously identified transient region is no longer transient, causing the encoder to provide that region to bitmap processor 275 for subsequent encoding.

Bitmap processor 275 can be one or more modules for processing non-transient regions. To assist with processing, bitmap processor 275 can contain bitmap encoder 276 and bitmap cache 278. Bitmap processor 275 can obtain non-transient regions that were previously processed in bitmap cache 278. Bitmap processor 275 can provide any regions not found in bitmap cache 278 to bitmap encoder 276 for additional processing. In some embodiments, bitmap encoder 276 and/or bitmap cache 278 are separate and distinct from bitmap processor 275 and/or encoder 270. After all regions of the display frame are encoded, encoder 270 can forward the frame to a remote device (e.g., client device 102) or provide the encoded display frame to another component of computing system 200.

Bitmap encoder 276 can be one or more modules for determining the optimal encoding method for different areas of the non-transient regions of the display frame. Bitmap encoder 276 can use multiple techniques to determine these encoding methods. In some embodiments, for example, bitmap encoder 276 classifies regions of the display frame as having large changes or small changes. In these embodiments, regions having small changes can be encoded using a lossy compression algorithm (e.g., JPEG or TIFF container holding compressed JPEG). Additionally, regions having large changes can be encoded using a lossless encoding algorithm (e.g., RLE, GIF for eight bits per pixel image data, PNG, or TIFF container holding PackBits) in order to preserve quality.

Embodiments consistent with the present disclosure are directed to improving the lossless encoding of data. The encoded data can comprise millions of pixels each represented by multiple bytes. Accordingly, even small gains in compression can yield huge savings in the amount of data that must be transmitted. Additionally, the technologies and techniques described herein can provide efficient lossless encoding with minimal or negligible increases in computing resource requirements.

Figure 3:
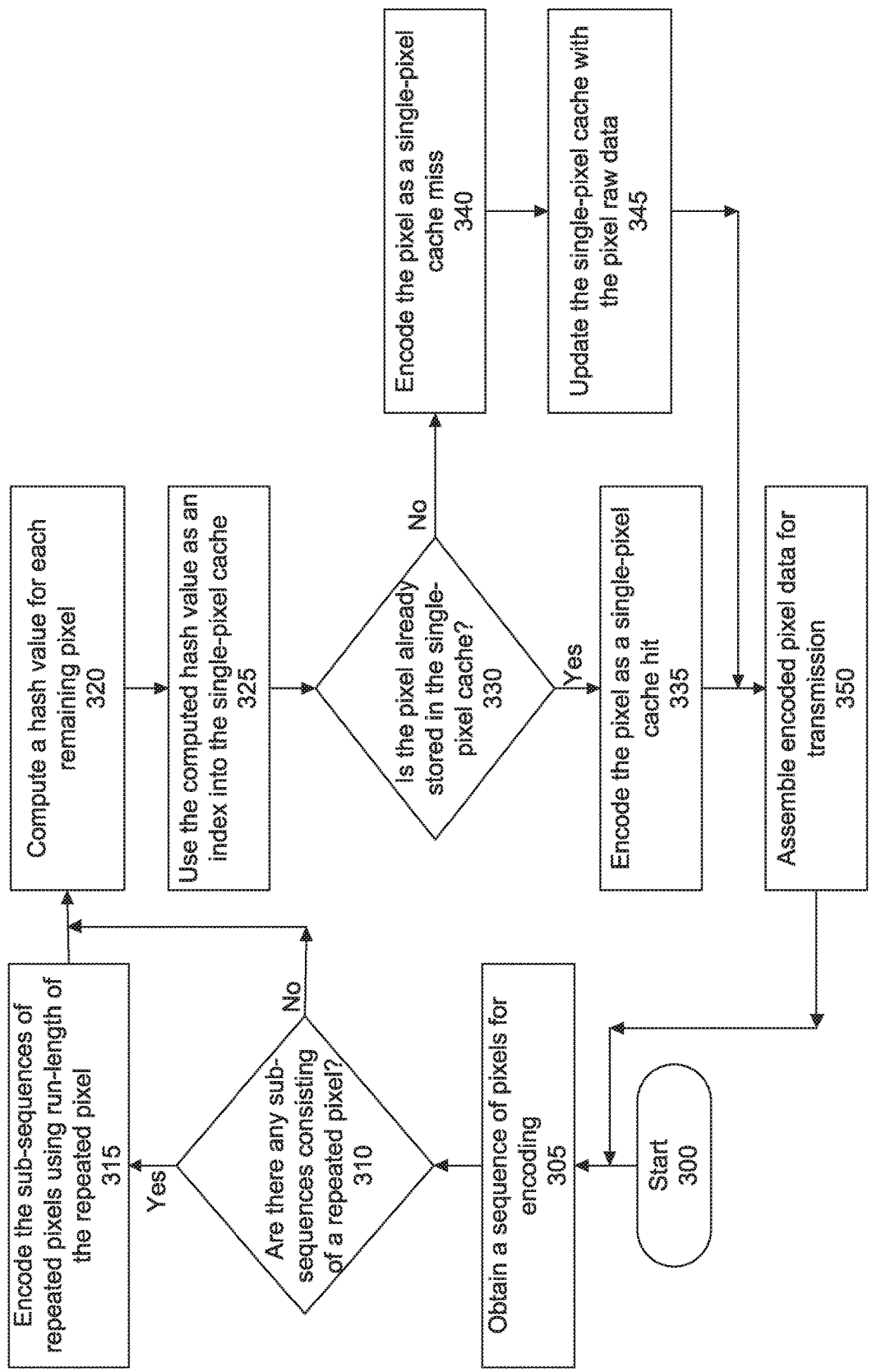
FIG. 3 is a flowchart of an exemplary method for encoding a sequence of pixels, consistent with embodiments of the present disclosure.

FIG. 3 is a flowchart of an exemplary method for lossless encoding of a sequence of pixels using a RLE and single-pixel cache, consistent with embodiments of the present disclosure. The exemplary method can be performed by, for example, bitmap encoder 276. It will be readily appreciated that the illustrated procedure can be altered to modify the order of steps, delete steps, or further include additional steps.

After initial step 300, an encoder (e.g., bitmap encoder 276) can obtain (step 305) a sequence of pixels for lossless encoding. In some embodiments, the sequence of pixels can comprise the non-transient region of the display frame identified for lossless encoding by the bitmap encoder 276. In some embodiments, each pixel in a display frame can be encoded using three bytes of data, one byte of data each for the red (R), green (G) and blue (B) components of the pixel. The encoder can provide lossless encoding of a sequence of pixels. For example the encoder can process fifteen pixels represented as the string "ABAAAAAAACCCCDB" (where, for the purposes of providing an example, each letter represents a unique pixel and repeated letters represent pixels with the exact same three byte value) using forty-five bytes of data, three bytes of data for each of the fifteen pixels.

In some embodiments, the encoder can determine (step 310) if the pixel sequence comprises of any sub-sequence consisting entirely of a repeated pixel. Any sub-sequence consisting entirely of a repeated pixel can be encoded (step 315) using a RLE. A RLE can encode a pixel sequence represented as string "ABAAAAAAACCCCDB", using run lengths, as "ABAY$_6$CY$_3$DB," where "Y$_6$" and "Y$_3$" each represents one byte of data denoting the number of repeat occurrences of the previous pixel. Accordingly, in this embodiment, RLE can provide lossless compression by encoding for output this exemplary pixel sequence using twenty bytes of data (six pixels at three bytes each and two bytes of data "Y$_6$" and "Y$_3$" representing run lengths) compared with forty-five bytes of raw pixel data.

Additionally, the encoder (e.g., bitmap encoder 276) can encode any remaining pixels not processed by step 315 using a single-pixel cache structure. The single-pixel cache structure can provide efficient encoding for sequences not exhibiting any runs of repeating pixels. For example, a basic RLE as described above cannot provide any compression benefit for a sequence of pixels without any repetition such as a sequence represented as string "ABCDABACABDE" and will encode this exemplary sequence using thirty-six bytes of data (twelve pixels at three bytes each). The encoder (e.g., bitmap encoder 276) using a single-pixel cache structure can compute a hash value for each pixel (step 320). In some embodiments, the hashing algorithm can be an XOR operation with a specific value in order to produce a hash value between 0 and 254. Some embodiments can use other hashing algorithms to produce the hash value. Different hashing algorithms can be chosen based on requirements to balance cost, probability of collisions (e.g., where the same hash value is generated for two different pixels), and computing resources. The computed hash value can be used as a look-up index into a single-pixel cache (step 325) as described in reference to FIG. 4.

Figure 4:
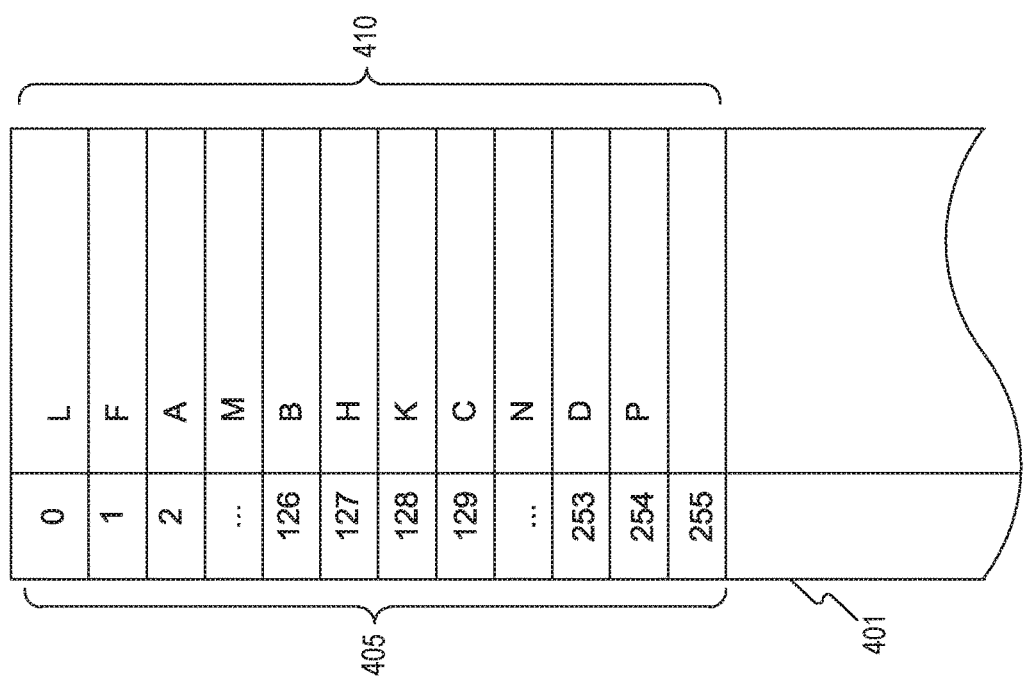
FIG. 4 illustrates an exemplary cache, consistent with embodiments of the present disclosure.

FIG. 4 illustrates an exemplary single-pixel cache data structure 401, consistent with embodiments of the present disclosure. Single-pixel cache 401 can be any data storage component (e.g., storage 228, system memory 222, cache 240, and/or CPU registers) that allows for the storage of data representing single pixels along with a reference to those stored pixels. Single-pixel cache 401 can include data structure comprising of an index 405 of hash values computed for single pixels and three bytes of data 410 representing each pixel. Given any hash value, single-pixel cache 401 can find index 405 equal to the hash value and retrieve the three bytes of data 410 representing a specific pixel. For example, with reference to FIG. 4, given a hash value of "129" single-pixel cache can retrieve the three bytes of data representing pixel "C."

Referring back to FIG. 3, the encoder can compare (step 330) the current pixel with the pixel stored in the single-pixel cache location indexed by the computed hash value. For cases where the comparison in step 330 does not yield an exact match, the encoder can encode the pixel as a cache miss (step 340). For example, for a sequence of pixels represented as string "ABCDABACABDE," and, assuming none of the pixels are already present in the single-pixel cache, the first four pixels "A," "B," "C," and "D" can be encoded as cache misses. The encoder can encode a cache miss using three bytes to represent the pixel data and one byte of data signaling a cache miss. In some embodiments, the single-pixel cache storage location corresponding to hash value index of 255 can be reserved (as depicted in FIG. 4) to indicate a single-pixel cache miss e.g. using symbol "X$_{255}$" to represent one byte of data corresponding to hash value 255, a cache miss for single pixel "A" can be encoded using a total of four bytes and represented as "X$_{255}$A." The first four cache misses for pixels "A," "B," "C," and "D" of the exemplary sequence "ABCDABACABDE" can be encoded using a total of sixteen bytes as "X$_{255}$AX$_{255}$BX$_{255}$CX$_{255}$D."

Additionally, the encoder (e.g. bitmap encoder 276) can update single-pixel cache 401 with the pixel data corresponding to the cache misses (step 345). For example, for a hash value of "2" computed for pixel represented as "A" and a cache-miss detected in step 330 for single pixel "A", the storage location corresponding to hash value index "2" within single-pixel cache 401 can be updated with data representing "A."

For cases where the comparison in step 330 yields an exact match, the encoder can encode the pixel as a cache hit (step 335). The encoder can signal a cache hit by omitting the three bytes of raw pixel data and only including the computed hash value in the encoded data output. For an exemplary sequence of pixels represented as string "ABCDABACABDE," where the first four pixels "ABCD" are encoded as cache misses "X$_{255}$AX$_{255}$BX$_{255}$CX$_{255}$D,"

the next seven pixels "ABACABD" (cache hits) can be encoded using their hash values only and represented as string "$X_2X_{126}X_2X_{129}X_2X_{126}X_{253}$," where "$X_2$," "$X_{126}$," "$X_{129}$," and "$X_{253}$" represent the single-byte hash value index locations of pixels "A", "B", "C", and "D" respectively within single-pixel cache 401. Accordingly, the twenty-one bytes of data corresponding to the seven pixels can be encoded using just seven bytes of data. This exemplary method can provide improved compression performance because, instead of using one byte of data to signal a cache hit and an additional byte of data to specify the storage location within single-pixel cache 401, the one byte of hash value data can be used to perform both of these functions.

The hashing algorithm used to compute hash values in step 320 can be chosen to minimize collisions, but any collisions that do occur can be handled similar to cache misses. For an exemplary sequence of pixels represented as string "ABCDABACABDE," and where the last pixel (represented by "E") yields the same hash value (represented by "$X_2$") as the earlier pixel represented by "A," the encoder can encode "E" as "$X_{255}E$" (similar to step 340 for a cache miss). Additionally, the encoder can update the single-pixel cache location corresponding to hash value "$X_2$" from data representing "A" to data representing "E" (similar to step 345 for a cache miss).

The encoder (e.g., bitmap encoder 276) can repeat steps 320-345 for all available pixels and assemble the encoded pixel data for transmission. Accordingly, an exemplary sequence of twelve pixels represented as string "ABCDABACABDE" can be encoded in the data output as string "$X_{255}AX_{255}BX_{255}CX_{255}D X_2X_{126}X_2X_{129}X_2X_{126}X_{253}X_{255}E$." This can provide efficient compression by utilizing a total of twenty-seven bytes of data (four cache misses at four bytes each, seven cache hits at one byte each and one collision at four bytes each) compared with thirty-six bytes of data (twelve pixels at three bytes each) for RLE without single-pixel cache.

Figure 5:
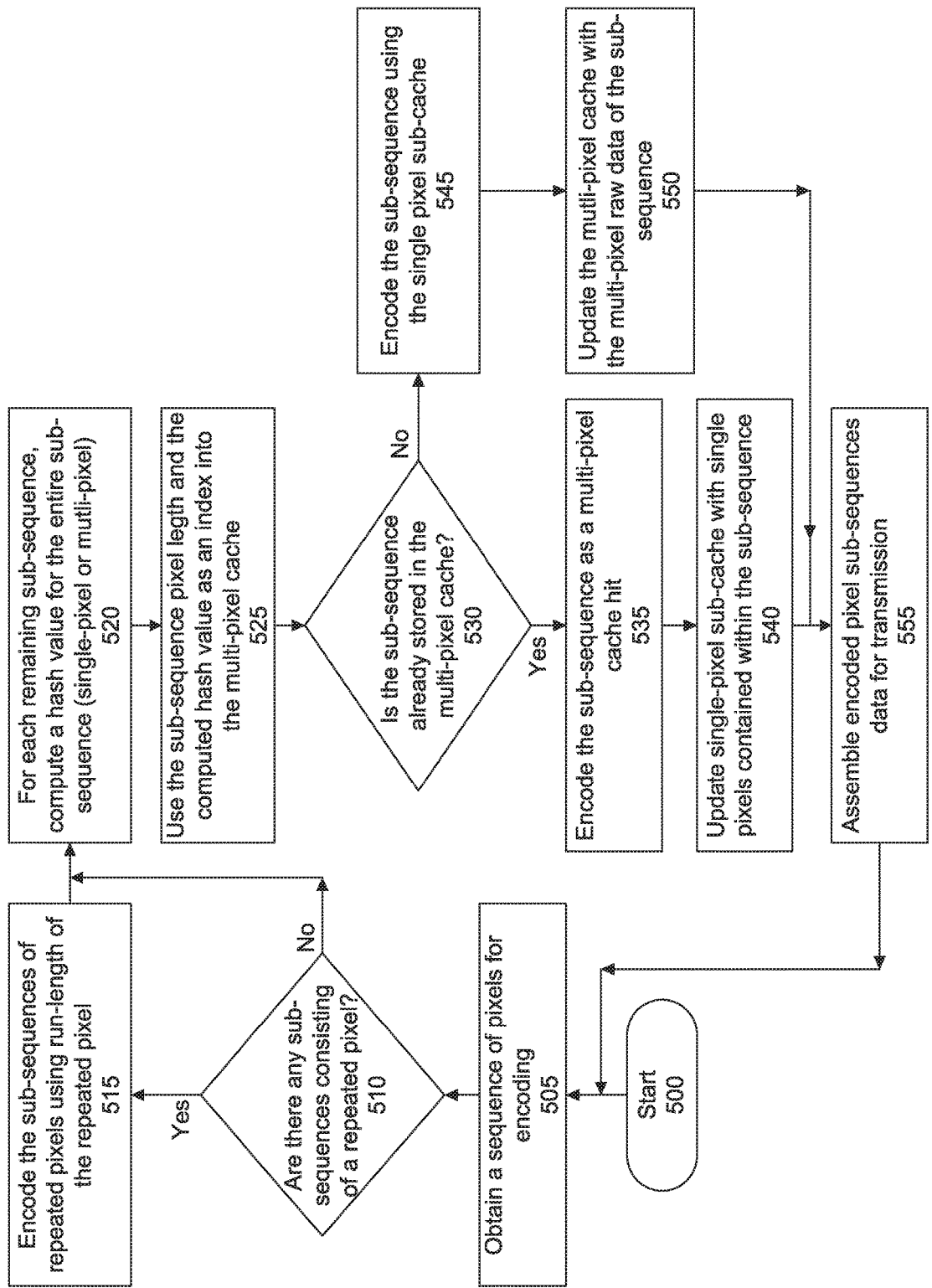
FIG. 5 is a flowchart of an exemplary method for encoding a sequence of pixels, consistent with embodiments of the present disclosure.

FIG. 5 is a flowchart of an exemplary method for lossless encoding of a sequence of pixels using RLE and multi-pixel cache structure, consistent with embodiments of the present disclosure. The exemplary method can be performed by, for example, bitmap encoder 276. Referring to FIG. 5, it will be readily appreciated that the illustrated procedure can be altered to modify the order of steps, delete steps or further include additional steps.

After initial step 500, an encoder (e.g., bitmap encoder 276) can obtain (step 505) a sequence of pixels for lossless encoding. In some embodiments, the sequence of pixels can comprise the non-transient region of the display frame identified for lossless encoding by bitmap encoder 276. In some embodiments, the encoder can determine (step 510) if the pixel sequence comprises of any sub-sequence consisting entirely of a repeated pixel. Any sub-sequences consisting entirely of a repeated pixel can be encoded (step 515) using RLE (similar to that described in reference to FIG. 3 above.).

Additionally, the encoder (e.g., bitmap encoder 276) can encode any remaining pixel sub-sequences not processed by step 515 using a multi-pixel cache structure. A hashing algorithm can be used to compute a hash value (step 520) for each remaining sub-sequence. A single hash value can be computed for the entire sub-sequence. In some embodiments, the hashing algorithm can be a XOR operation with a specific value in order to produce a hash value between 0 and 255. Some embodiments can use other hashing algorithms to produce the hash value. Hashing algorithms can be chosen to balance cost, probability of collisions (e.g., the same hash value generated for two different sub-sequences of the same length), and computing resources. The computed hash value can be used as a look-up index into a multi-pixel cache (step 525) as described in reference to FIG. 6.

Figure 6:
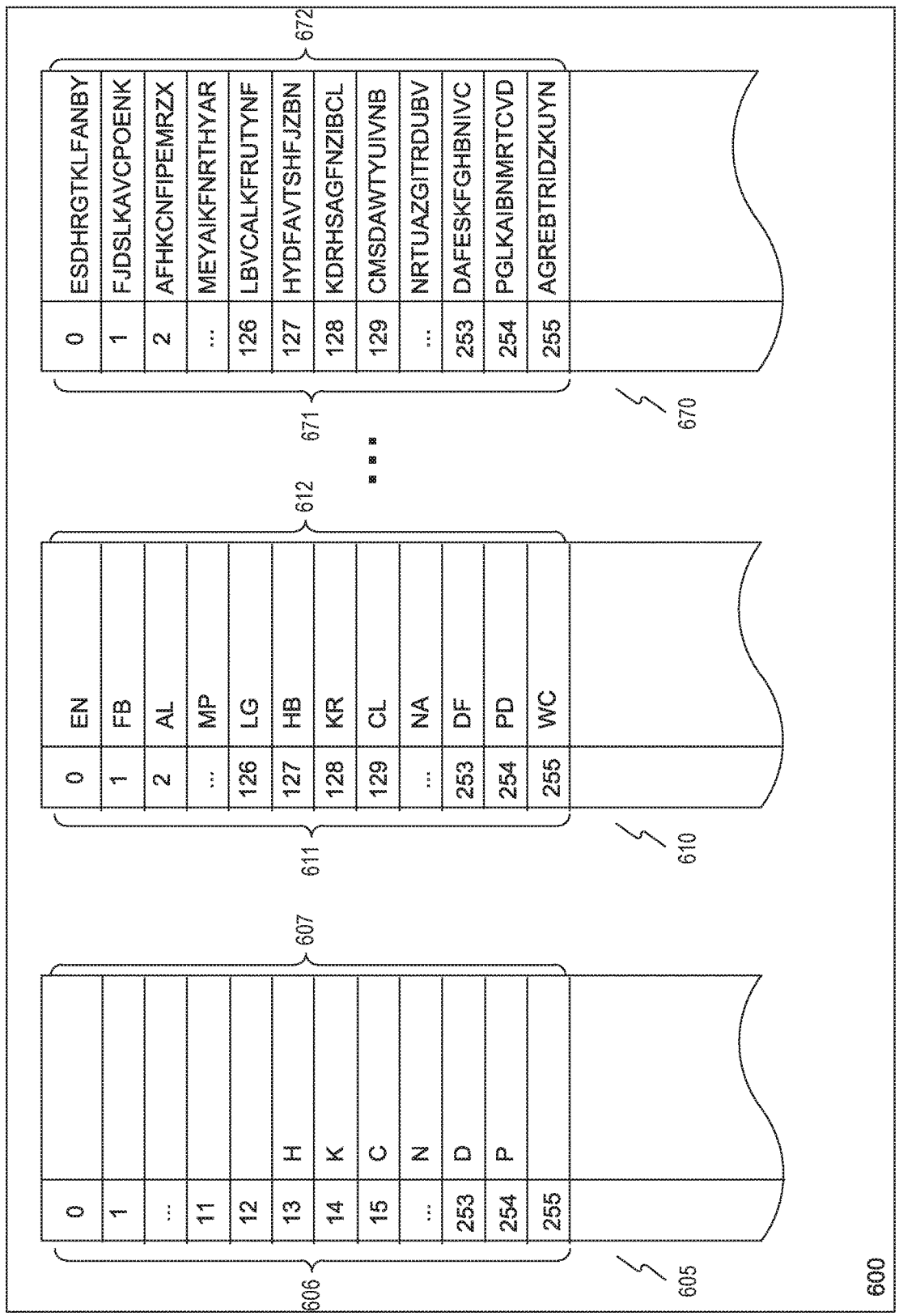
FIG. 6 illustrates an exemplary cache, consistent with embodiments of the present disclosure.

FIG. 6 illustrates an exemplary multi-pixel cache data structure 600, consistent with embodiments of the present disclosure. Multi-pixel cache 600 can be any data storage component (e.g., storage 228, system memory 222, cache 240, and/or CPU registers) that allows for the storage of data representing sub-sequences comprising single or multiple pixels along with a reference to the stored data. Multi-pixel cache 600 can include sub-caches. For example, the multi-pixel cache can comprise of fourteen sub-caches, with the first sub-cache 605 storing data representing single-pixel sub-sequences, the second sub-cache 610 storing data representing two-pixel sub-sequences, and similar structures extended up to a fourteenth sub-cache 670 storing data representing fourteen-pixel sub-sequences.

The multi-pixel cache 600 can comprise of fewer than fourteen sub-caches or more than fourteen sub-caches. The number of sub-caches is only limited by the physical limitations of the memory in which multi-pixel cache 600 is stored and there is no theoretical limitation on the number of sub-caches that multi-pixel cache 600 can utilize. Moreover, in some embodiments, the probability of a multi-pixel cache hit can decrease rapidly as the pixel length of the sub-sequence increases and hence increasing the number of sub-caches will not necessarily provide linear improvements in performance. The optimal number of sub-caches used can be based on experimental data, analytics, statistical analysis, an arbitrary selection made by a user, or any other method of choosing a number of sub-caches. Additionally, the number of sub-caches can be changed over time to balance performance and system requirements.

Each of the multi-pixel sub-caches can include a data structure comprising of a hash value (computed from single-pixel or multi-pixel sub-sequences) index (e.g., 606, 611, 671) and the corresponding data (e.g., 607, 612, 672) representing the single-pixel or multi-pixel sub-sequences. The single-pixel sub-cache 605 within the multi-pixel cache can be structurally equivalent to the single-pixel cache structure described in relation to FIG. 4, comprising of an index 606 of hash values computed for single pixels and storing three bytes of data 607 representing the single pixels.

The encoder can use the length of the pixel sub-sequence and the computed hash value as an index into the multi-pixel cache (step 525). For example, for a hash value of "126" computed for a two-pixel sub-sequence, multi-pixel cache 600 exemplified in FIG. 6 can retrieve data corresponding to two pixels represented as string "LG" from the location indexed "126" within two-pixel sub-cache 610. However, for the same hash value of "126" computed for a fourteen pixel sub-sequence, multi-pixel cache 600 exemplified in FIG. 6 can retrieve data corresponding to fourteen pixels represented as string "LBVCALKFRUTYNF" from the location indexed "126" within fourteen-pixel sub-cache 670.

Referring back to FIG. 5, the encoder can compare (step 530) the current sub-sequence with the sub-sequence stored in the referenced multi-pixel cache location. For cases where the comparison in step 530 does not yield an exact match, the encoder can encode the sub-sequence using single-pixel sub-cache 605 (step 545). An exemplary sequence of pixels represented as string "ABCDEEEEEEEEEEABCDE" can be split into three sub-sequences—"ABCDE," "EEEEEEEEE," and "ABCDE." The middle sequence "EEEEEEEEE" can be encoded using RLE as nine repetitions of the previous pixel "E" and represented as "$Y_9$," where "$Y_9$" represents one byte of data indicating nine repetitions of the previous pixel. Assuming that the first sub-sequence "ABCDE" is not already present in multi-pixel cache 600, "ABCDE" is a multi-pixel cache miss and can be encoded using single-pixel sub-cache 605 (step 545). Assuming none of the single pixels are already present in single-pixel sub-cache 605, the sub-sequence "ABCDE" can be encoded as five single-pixel sub-cache misses "$X_{255}AX_{255}BX_{255}CX_{255}DX_{255}E$," where symbol "$X_{255}$" represents one byte of data used to signal each single-pixel sub-cache miss (similar to a single-pixel cache miss as described in reference to FIG. 3). Additionally, the encoder can update single-pixel sub-cache 605 with the data corresponding to the single pixels "A," "B," "C," "D," and "E" (similar to single-pixel cache update as described in reference to FIG. 3) and also update the five-pixel sub-cache (step 550) with the data corresponding to the entire sub-sequence "ABCDE."

For cases where the comparison in step 530 yields an exact match, the encoder can encode the sub-sequence as a multi-pixel cache hit (step 535). In some embodiments, the initial locations within the single-pixel sub-cache 605 can be reserved for signaling a multi-pixel cache hit. For example, in a multi-pixel cache structure comprising of fourteen sub-caches 605-670, the initial locations zero to twelve within the single-pixel sub-cache 605 can be reserved for signaling specific multi-pixel sub-cache hits. The location indexed "0" can be reserved for a two-pixel sub-cache hit, the location indexed "1" can be reserved for a three-pixel sub-cache hit and similar logic extended up to location indexed "12" reserved for fourteen-pixel sub-cache hit. Accordingly, a multi-pixel cache hit for the third sub-sequence "ABCDE" comprised within the exemplary sequence "ABCDEEEEEEEEEABCDE" discussed above can be encoded using only two bytes of data represented as string "$X_3X_{5n}$," one byte of data represented by "$X_3$" for reference to the five-pixel sub-cache and one byte of data represented by "$X_{5n}$" for the hash value index of the storage location within the five-pixel sub-cache. Accordingly, the exemplary sequence represented as string "ABCDEEEEEEEEEABCDE" can be encoded for output as "$X_{255}AX_{255}BX_{255}CX_{255}DX_{255}EY_9X_3X_{5n}$."

Additionally, in some embodiments, single-pixel sub-cache 605 can be updated (step 540) with any single pixels contained within the multi-pixel sub-sequence but missing within single-pixel sub-cache 605. This can keep the single-pixel sub-cache updated with the most recently encoded single pixels. For example, for a multi-pixel cache hit for sub-sequence represented as string "ABCDE," single pixel sub-cache 605 can be updated if any of the single pixels "A," "B," "C," "D," or "E" are not already present in the single pixel sub-cache.

In some embodiments, the encoder (e.g., bitmap encoder 276) can save one byte of data by not specifically signaling a multi-pixel cache miss. This can be implemented by reserving the initial locations within single-pixel sub-cache 605 for signaling a multi-pixel cache hit as described above. For example, for multi-pixel cache 600 illustrated in FIG. 6 and comprising of fourteen sub-caches 605-670, the initial locations zero to twelve within the single-pixel sub-cache 605 can be reserved for signaling specific multi-pixel cache hits and a value greater than twelve can indicate a multi-pixel cache miss signal. No additional byte is required to signal a multi-pixel cache miss. Additionally, the single-pixel hashing algorithm can be modified to generate values between thirteen and two hundred fifty-four (both inclusive) to exclude the use of these locations for caching of single pixels.

A pixel sub-sequence with a length greater than the maximum provided by any of the multi-pixel sub-caches can be encoded using the single-pixel sub-cache similar to the scenario of a multi-pixel cache miss. For a multi-pixel cache embodiment with fourteen sub-caches, any sub-sequence longer than fourteen pixels can be encoded using the single-pixel scheme exemplified in FIG. 3. In some embodiments, sub-sequences longer than fourteen pixels can also be split into multiple sub-sequences that less than the maximum sub-sequence value and each new sub-sequence can then be processed using the multi-pixel cache.

The exemplary method for lossless encoding of a sequence of pixels, using RLE and multi-pixel cache structure, can provide an increased compression benefit compared with using RLE alone or the exemplary method using RLE and a single-pixel cache described in relation to FIG. 3. For example, a lossless encoder not using any of these compression methods can encode a sequence of pixels represented as string "ABCDEEEEEEEEEABCDE" using fifty-seven bytes of data (nineteen pixels at three bytes of data each). A lossless encoder using RLE alone can encode this exemplary sequence as "ABCDEY$_9$ABCDE" using thirty-one bytes of data (ten pixels at three bytes of data each and one byte of data "$Y_9$" representing run length of repeated pixel "E"). A lossless encoder using the exemplary method described in FIG. 3 (RLE and single-pixel cache) can encode this exemplary sequence as "$X_{255}AX_{255}BX_{255}CX_{255}DX_{255}EY_9X_2X_{126}X_{129}X_{253}X_{201}$," using twenty-six bytes of data (five single-pixel cache misses at four bytes of data each, one byte of data representing run length of repeated pixel "E," and five single-pixel cache hits at one byte of data each). A lossless encoder using the exemplary method described in FIG. 5 (RLE and multi-pixel cache) can encode this exemplary sequence as "$X_{255}AX_{255}BX_{255}CX_{255}DX_{255}EY_9X_3X_{5n}$," using twenty-three bytes of data (initial multi-pixel cache miss encoded as five single-pixel cache misses at four bytes of data each, one byte of data representing run length of repeated pixel "E," and two bytes of data representing a five-pixel sub-cache hit). Accordingly, an encoder using a multi-pixel cache can provide superior lossless compression benefit compared with an encoder using single-pixel cache or no cache structure.

The encoded data can be forwarded to a remote device (e.g., client device 102) or to another component of computing system 200. A decoder within the remote device or within the computing system 200 can be used to decode the encoded data stream. The decoder can utilize a multi-pixel cache structure as illustrated in FIG. 6.

Figure 7:
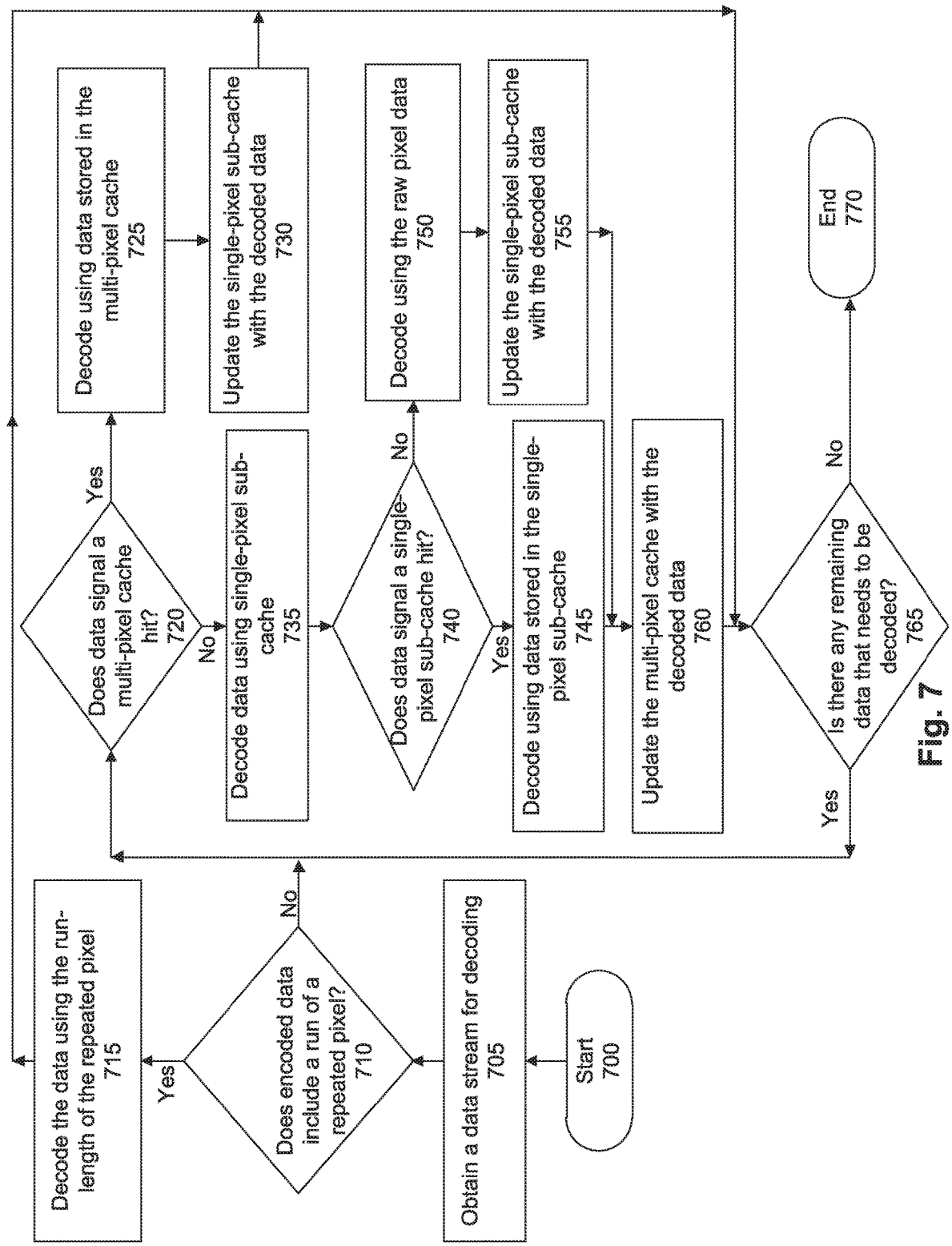
FIG. 7 is a flowchart of an exemplary method for decoding a sequence of pixels, consistent with embodiments of the present disclosure.

FIG. 7 is a flowchart of an exemplary method for decoding of the encoded data, consistent with embodiments of the present disclosure. Referring to FIG. 7, it will be readily appreciated that the illustrated procedure can be altered to modify the order of steps, delete steps or further include additional steps. After initial step 700, a decoder can obtain an encoded data stream for decoding (step 705). For example, the decoder can receive encoded data transmitted from a lossless encoder (e.g. bitmap encoder 276) that encoded a sequence of pixels represented as string "ABCDEEEEEEEEEABCDE" using exemplary method as described in relation to FIG. 5 as "$X_{255}AX_{255}BX_{255}CX_{255}DX_{255}EY_9X_3X_{5n}$." Moreover the decoder can use its own multi-pixel cache.

The decoder can determine if the data includes runs of repeated pixels (step 710). The decoder can decode (step 715) any runs of repeated pixels using the encoded run-length data. For exemplary encoded data "$X_{255}AX_{255}CX_{255}CX_{255}DX_{255}EY_9X_3X_{5n}$," the one byte of data represented by "$Y_9$" can be decoded as nine repeated occurrences of previous pixel and represented as "EEEEEEEEE."

The decoder can also determine (step 720) if remaining data signals any multi-pixel cache hits or any multi-pixel cache misses. For a multi-pixel cache miss, the decoder can decode the data using the single-pixel sub-cache (step 735). For every multi-pixel cache miss, the decoder can determine if there are any single-pixel sub-cache hits (step 740). For any single-pixel sub-cache hit, the decoder can decode (step 745) using the data already stored in the single-pixel sub-cache. For any single-pixel sub-cache miss, the decoder can use the raw pixel data within the data stream (step 750). For exemplary encoded data "$X_{255}AX_{255}BX_{255}CX_{255}DX_{255}EY_9X_3X_{5n}$," the one byte of data represented by "$X_{255}$" can be decoded as a multi-pixel and single-pixel cache miss and the data string represented as "$X_{255}AX_{255}BX_{255}CX_{255}DX_{255}E$" can be decoded and represented as "ABCDE."

Additionally the decoder can update its single-pixel sub-cache (step 755) with the five single-pixel cache misses "A," "B," "C," "D," and "E." The decoder can also update its five-pixel sub-cache within the multi-pixel cache (step 760) with the multi-pixel cache miss for five pixel string represented as "ABCDE." By updating its own single-pixel cache and multi-pixel cache as the data is decoded, the decoder can ensure that its cache data matches the data stored in the encoder when the specific values being decoded were processed by the encoder and that any future cache hits processed by the decoder will return appropriate values.

For a multi-pixel cache hit detected in step 720, the decoder can decode (step 725) using the data already stored in the multi-pixel cache. For exemplary encoded data "$X_{255}AX_{255}BX_{255}CX_{255}DX_{255}EY_9X_3X_{5n}$," the one byte of data represented by "$X_3$" can be decoded as a multi-pixel cache hit for the five-pixel sub-cache and the one byte of data represented by "$X_{5n}$" can be decoded as the storage location index of the data representing the five pixel sub-sequence. The decoder can retrieve data from its multi-pixel cache and decode the two bytes of encoded data "$X_3X_{5n}$" and represent it as "ABCDE." The decoder can repeat these steps until all the data obtained in step 705 are decoded. An exemplary sequence of encoded data received from an encoder (e.g. bitmap encoder 276) and represented as "$X_{255}AX_{255}BX_{255}CX_{255}DX_{255}EY_9X_3X_{5n}$" can be decoded and represented as string "ABCDEEEEEEEEEABCDE."

In some embodiments, the initial single-pixel sub-cache locations within the decoder can be reserved for signaling a multi-pixel cache hit in order to match a similar reservation within the encoder. Additionally, in some embodiments, the decoder can match the encoder and update the single-pixel sub-cache (step 730) with any pixels contained within the multi-pixel cache hit that are missing in the single-pixel sub-cache.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only. It is also intended that the sequence of steps shown in figures are only for illustrative purposes and are not intended to be limited to any particular sequence of steps. As such, those skilled in the art can appreciate that these steps can be performed in a different order while implementing the same method.

What is claimed is:

1. A method, comprising:
   obtaining, by a computing device, encoded data to be decoded, the encoded data including (i) a first data unit referencing a sub-cache of a plurality of sub-caches that is associated with a total number of non-repeated pixel values contained in a given non-repeating sub-sequence of a sequence of pixels and (ii) a second data unit referencing an index value of a storage location within the referenced sub-cache where the given non-repeating sub-sequence is stored;
   decoding, by the computing device, the encoded data using the first and second data units to generate decoded data comprising the given non-repeating sub-sequence of the sequence of pixels in a decoded format; and
   providing, by the computing device, the decoded data in which the given non-repeating sub-sequence is decompressed, and the given non-repeating sub-sequence which is decompressed further including a total number of bytes larger than a corresponding portion of the encoded data.

2. The method of claim 1, further comprising decoding, by the computing device, a remaining portion of the encoded data by determining whether a multi-pixel cache miss exists.

3. The method of claim 2, further comprising in response to a determination that the multi-pixel cache miss exists, determining, by the computing device, whether a single-pixel sub-cache hit or a single-pixel sub-cache miss exists.

4. The method of claim 3, further comprising in response to a determination that the single-pixel sub-cache hit exists, decoding, by the computing device, the encoded data using data previously stored in a single-pixel sub-cache of a multi-pixel cache.

5. The method of claim 3, further comprising in response to a determination that the single-pixel sub-cache miss exists, decoding, by the computing device, the encoded data with raw pixel data of the encoded data.

6. The method of claim 1, wherein the one byte of data represented by a third data unit of the encoded data is decoded as multi-pixel miss and a single-pixel miss.

7. The method of claim 1, further comprising updating, by the computing device, a single pixel cache with a plurality of single-pixel cache misses to ensure data within the single pixel cache matches data stored in an encoder.

8. The method of claim 1, further comprising decoding, by the computing device, another portion of the sequence of pixels using a third data unit of the encoded data that is indicative of an index representative of a pixel subsequence.

9. The method of claim 1, wherein the encoded data comprises an image file.

10. The method of claim 9, wherein the decoding of the encoded data results in a lossless compression of the image file.

11. The method of claim 9, wherein the image file has a Portable Network Graphics ("PNG") format.

12. A device comprising:
   a memory; and
   a processor coupled to the memory and configured to obtain encoded data to be decoded, the encoded data including (i) a first data unit referencing a sub-cache of a plurality of sub-caches that is associated with a total number of non-repeated pixel values contained in a given non-repeating sub-sequence of a sequence of pixels and (ii) a second data unit referencing an index value of a storage location within the references sub-cache where the given non-repeating sub-sequence is stored;

decode the encoded data using the first and second data units to generate decoded data comprising the given non-repeating sub-sequence of the sequence of pixels in a decoded formate; and provide the decoded data in which the given non-repeating sub-sequence is decompressed and the given non-repeating sub-sequence which is decompressed further including a total number of bytes larger than a corresponding portion of the encoded data.

13. The device of claim 12, wherein the processor is further configured to decode a remaining portion of the encoded data by determining whether a multi-pixel cache miss exists.

14. The device of claim 13, wherein in response to a determination that the multi-pixel cache miss exists, the processor is further configured to determine whether a single-pixel sub-cache hit or a single-pixel sub-cache miss exists.

15. The device of claim 14, wherein in response to a determination that the single-pixel sub-cache hit exists, the processor is further configured to decode the encoded data using data previously stored in a single-pixel sub-cache of a multi-pixel cache.

16. The device of claim 14, wherein in response to a determination that that single-pixel sub-cache miss exists, the processor is further configured to decode the encoded data with raw pixel data of the encoded data.

17. The device of claim 12, wherein the processor is further configured to update a single pixel cache with a plurality of single-pixel cache misses to ensure data within the single pixel cache matches data stored in an encoder.

18. The device of claim 12, wherein the processor is further configured to decode another portion of the sequence of pixels using a third data unit of the encoded data that is indicative of an index representative of a pixel subsequence.

19. A non-transitory computer readable medium encoded with instructions that when executed by one or more processors facilitate operation of an electronic device according to a process, the process comprising:

obtaining encoded data to be decoded, the encoded data including (i) a first data unit referencing a sub-cache of a plurality of sub-caches that is associated with a total number of non-repeated pixel values contained in a given non-repeating sub-sequence of a sequence of pixels and (ii) a second data unit referencing an index value of a storage location within the referenced sub-cache where the given non-repeating sub-sequence is stored;

decoding the encoded data using the first and second data units to generate decoded data comprising the given non-repeating sub-sequence of the sequence of pixels in a decoded format; and providing the decoded data in which the given non-repeating sub-sequence is decompressed, and the given non-repeating sub-sequence which is decompressed further including a total number of bytes larger than a corresponding portion of the encoded data.

20. The computer readable medium of claim 19, further comprising updating a single pixel cache with a plurality of single-pixel cache misses to ensure data within the single pixel cache matches data stored in an encoder.

* * * * *